United States Patent
Elmakias

(10) Patent No.: US 9,887,759 B2
(45) Date of Patent: Feb. 6, 2018

(54) SYSTEM AND METHOD FOR RECEIVING AND PROCESSING ARRAY ANTENNA SIGNALS

(71) Applicant: Elta Systems Ltd., Ashdod (IL)

(72) Inventor: Michael Elmakias, Ashdod (IL)

(73) Assignee: Elta Systems Ltd., Ashdod (IL)

( * ) Notice: Subject to any disclaimer, the term of this patent is extended or adjusted under 35 U.S.C. 154(b) by 0 days.

(21) Appl. No.: 14/899,271

(22) PCT Filed: Jun. 17, 2014

(86) PCT No.: PCT/IL2014/050548
§ 371 (c)(1),
(2) Date: Dec. 17, 2015

(87) PCT Pub. No.: WO2014/203249
PCT Pub. Date: Dec. 24, 2014

(65) Prior Publication Data
US 2016/0142125 A1   May 19, 2016

(30) Foreign Application Priority Data
Jun. 17, 2013 (IL) .......................... 226992

(51) Int. Cl.
*H04B 7/08* (2006.01)
*H03M 1/12* (2006.01)

(52) U.S. Cl.
CPC ............ *H04B 7/08* (2013.01); *H04B 7/0837* (2013.01); *H03M 1/122* (2013.01)

(58) Field of Classification Search
CPC .......... H04B 7/08; H04B 7/0837; H04B 1/38; H04L 1/06; H04L 27/06; H04J 3/00; H03M 1/122
See application file for complete search history.

(56) References Cited

U.S. PATENT DOCUMENTS 6,784,831 B1   8/2004   Wang et al.
7,941,061 B2   5/2011   Kadowaki
(Continued)

FOREIGN PATENT DOCUMENTS

| EP | 0492821 A2 | 7/1992 | |
|---|---|---|---|
| IL | WO 2011158230 A2 * | 12/2011 | ........... H04L 5/0023 |
| WO | 2011/158230 A2 | 12/2011 | |

OTHER PUBLICATIONS

Balasem., S.S. et al., "Beamforming Algorithms Technique by Using MVDR and LCMV," World Applied Programming, May 31, 2012, pp. 315-324, vol. 2, Issue 5.

*Primary Examiner* — Syed Haider
(74) *Attorney, Agent, or Firm* — Mintz Levin Cohn Ferris Glovsky and Popeo, P.C.; Steven M. Jensen

(57) ABSTRACT

A system for receiving signals from an array antenna that includes a first number of antenna elements, including an orthogonal signals generator module configured to generate the first number of orthogonal signals. Plurality of multipliers configured to receive array antenna element analog signals and the first number of orthogonal signals and generate a corresponding multiplied analog signal, giving rise to a first number of multiplied analog signals. A second number of summation modules configured to receive the first number of multiplied analog signals from the multipliers and generate a second number of summed analog signals. A second number of analog to digital converters configured to receive the summed analog signals and generate the second number of summed digital signals. The summed digital signals are capable of being fed to a digital processor for generating a processed signal of the array antenna, wherein the second number falls in the range of 1 to less than the first number.

15 Claims, 16 Drawing Sheets

(56) References Cited

U.S. PATENT DOCUMENTS

| | | | | |
|---|---|---|---|---|
| 2003/0152050 A1* | 8/2003 | Mochizuki | .......... | H04L 27/2647 |
| | | | | 370/332 |
| 2004/0116078 A1 | 6/2004 | Rooyen et al. | | |
| 2007/0121768 A1* | 5/2007 | Rooyen | ................ | H04B 7/0848 |
| | | | | 375/347 |
| 2008/0240031 A1* | 10/2008 | Nassiri-Toussi | ..... | H04B 7/0408 |
| | | | | 370/329 |
| 2013/0114588 A1* | 5/2013 | Kyperountas | ........ | H04B 1/0064 |
| | | | | 370/345 |

* cited by examiner

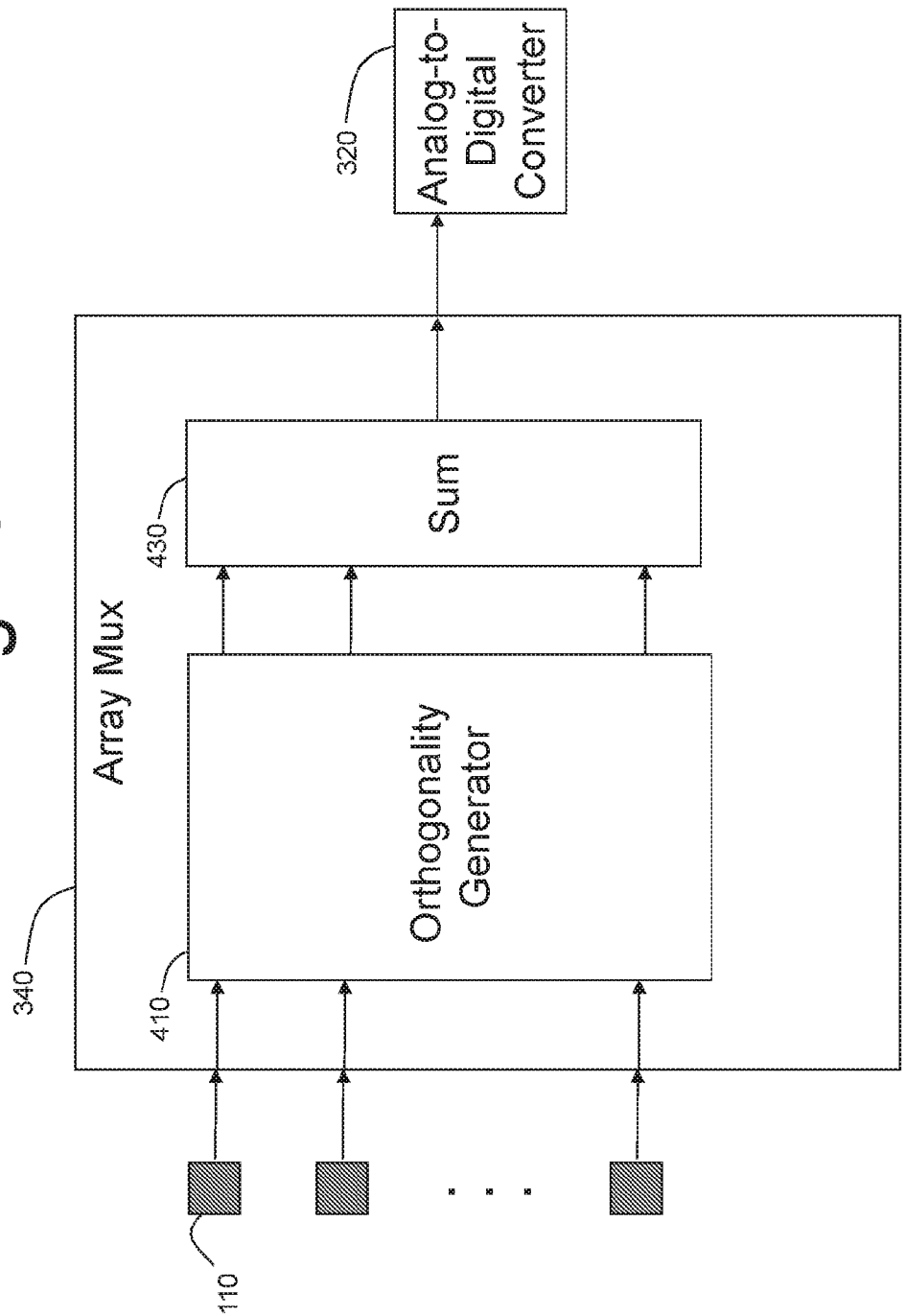

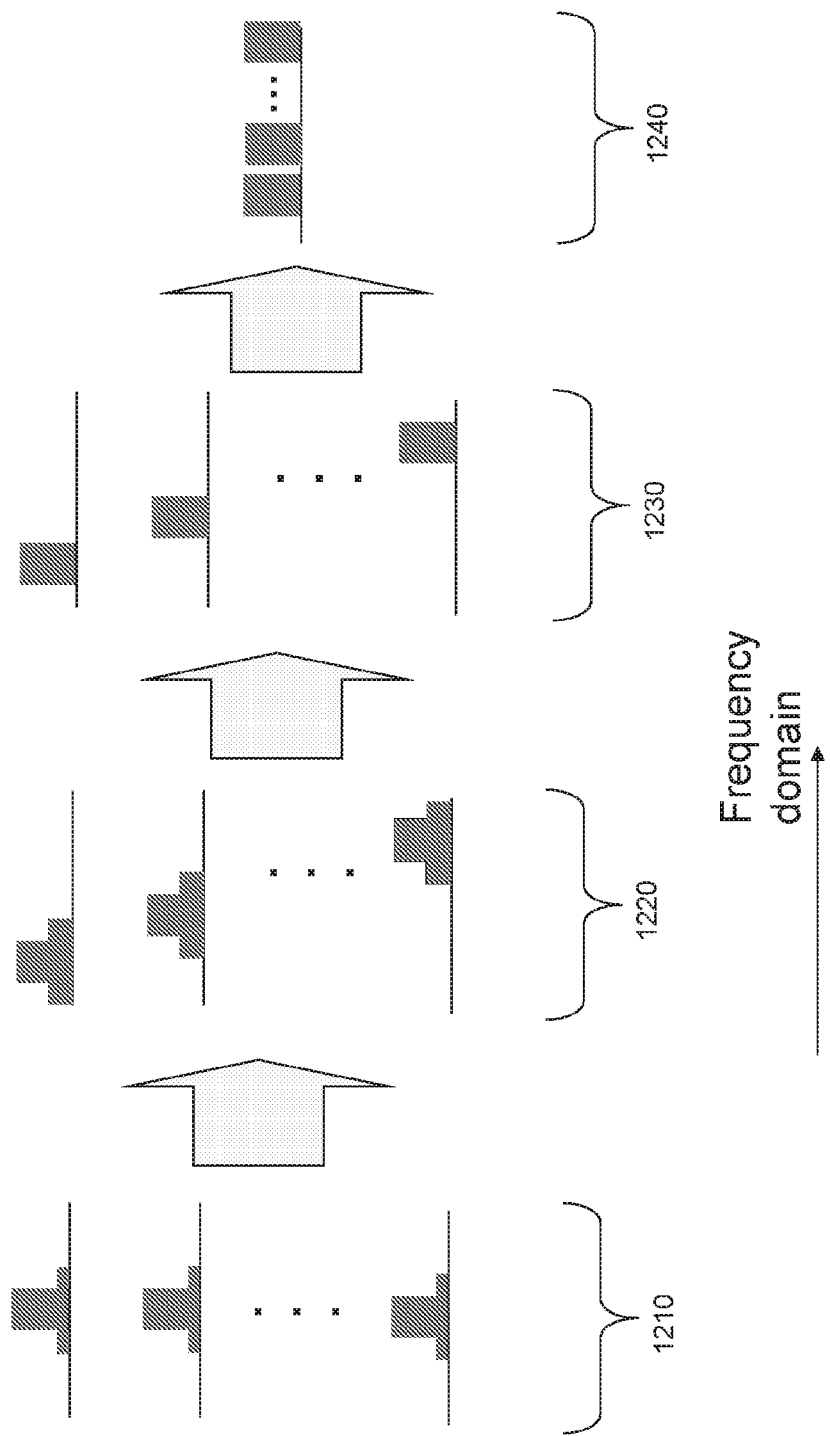

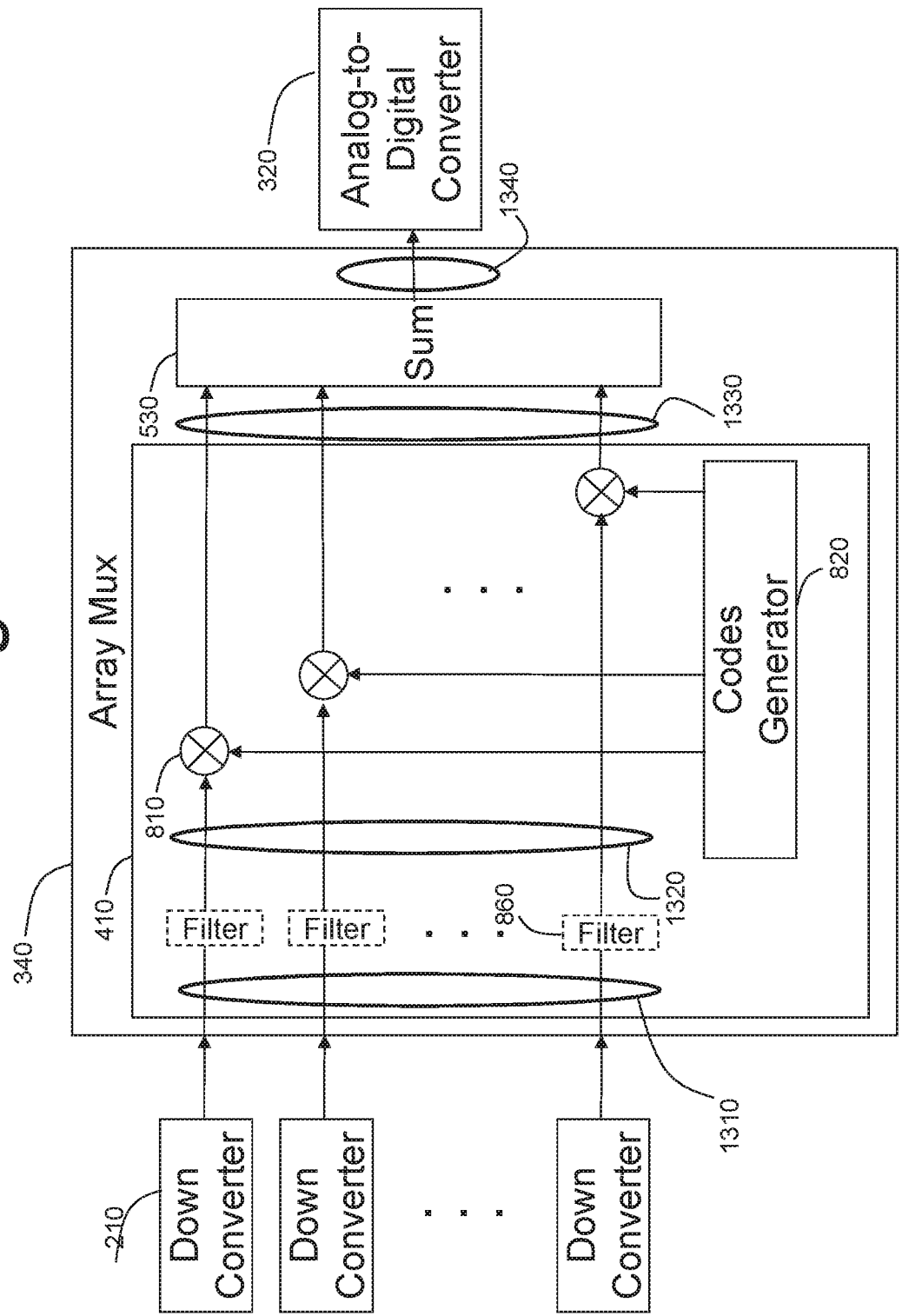

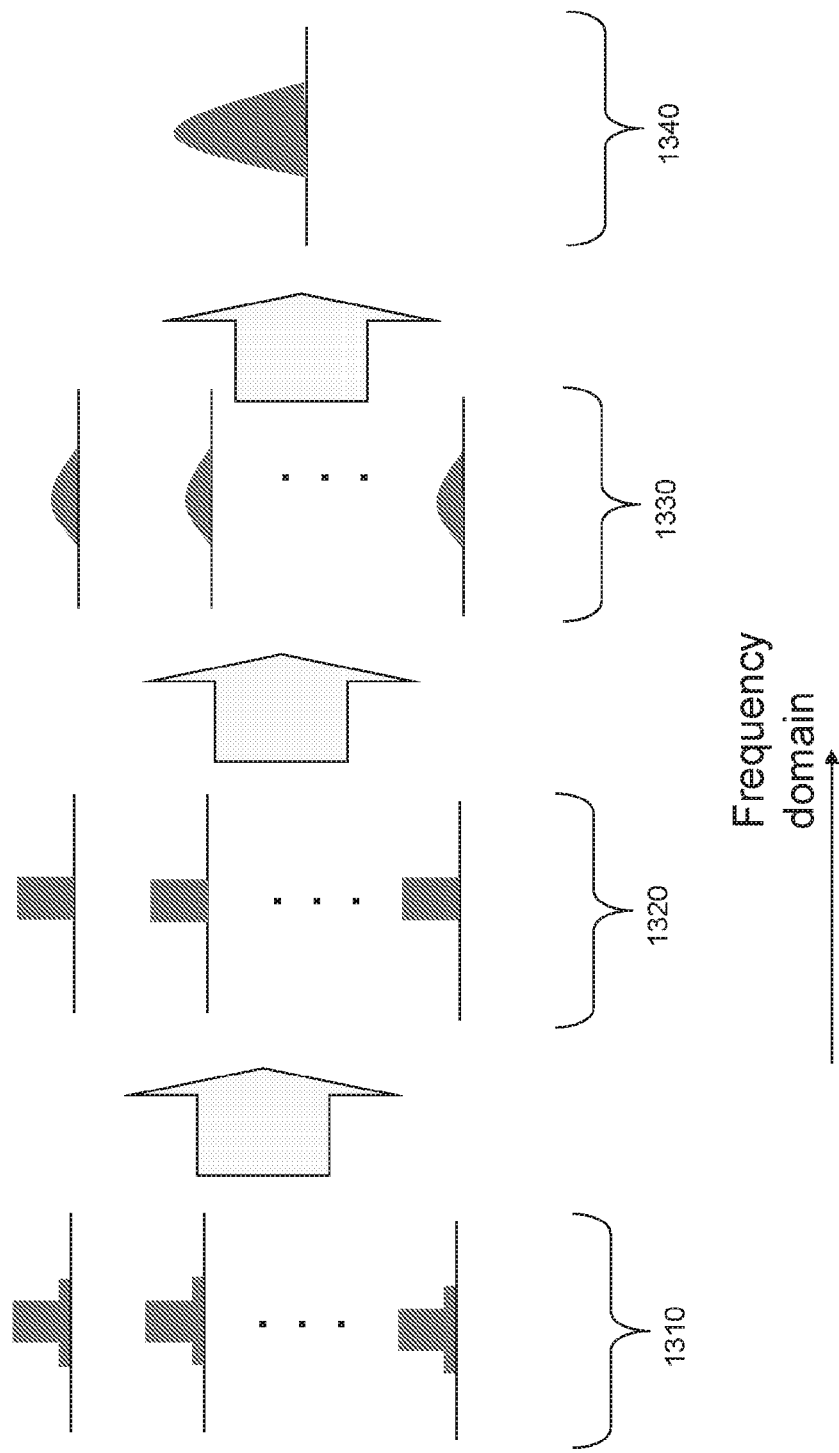

SYSTEM AND METHOD FOR RECEIVING AND PROCESSING ARRAY ANTENNA SIGNALS

FIELD OF THE INVENTION

The present invention relates generally to the field of receiving and processing array antenna signals.

BACKGROUND OF THE INVENTION

Antenna array systems, and in particular processed or phased array antenna systems, are known in the art. FIG. 1 (Prior art) presents a simplified block diagram of a typical receive antenna array 100 having a plurality of receiving antenna elements 110. FIG. 2 presents an additional example of a typical simplified block diagram of the internal processing chain within the antenna array 100. In addition to the antenna array elements, there is optionally down-converter 210 in order to convert the received RF (radio frequency) analog signals to IF (intermediate frequency) analog signals or base-band analog signals. There may be optionally one down-converter (that converts all RF signals from all elements together) or a set of down-converters (i.e. one per each element) as presented in FIG. 2. Following the down-converter, the analog signals are converted to digital signals by analog-to-digital converters (ADC) 220. Usually there is ADC per antenna element. Thereafter, the digital signals are processed by the digital array processor 230 implementing various array processing techniques 240. Example of such array processing techniques are Digital Beam Forming (DBF), beam steering, MVDR, etc. Usually, as the number of antenna array elements increases, the complexity and implementation difficulty also increases, because the number of ADCs increases. The ADC is one of the main components that consume power in the receiving chain, and as the number of ADC grows, the power consumption grows (linearly, in accordance with the number of antenna elements).

Therefore there is a need in the art for new techniques with less complex power/volume/weight efficient receiving and processing (phased) array antenna systems implementing less than antenna element analog-to-digital converters (preferably even a single ADC, if feasible).

Multiplexing techniques for multiplexing channel in communication systems are known in the art. For example, Frequency Division Multiple Access (FDMA), Code Division Multiple Access (CDMA), Time Division Multiple Access (TDMA) and Orthogonal Frequency Division Multiplex (OFDM) are multiplexing techniques known in the art.

SUMMARY OF THE INVENTION

In accordance with an aspect of the presently disclosed subject matter, there is provided a system for receiving signals from an array antenna that includes a first number of antenna elements, comprising an orthogonal signals generator module configured to generate the first number of orthogonal signals; first number multipliers each configured to receive a respective array antenna element analog signal and a respective orthogonal signal of the first number of orthogonal signals and generate a corresponding multiplied analog signal, giving rise to a first number of multiplied analog signals; a second number of summation modules configured to receive the first number of multiplied analog signals from the multipliers and generate a second number of summed analog signals, a second number of analog to digital converters configured to receive the summed analog signals and generate the second number of summed digital signals; the summed digital signals are capable of being fed to a digital processor for generating a processed signal of the array antenna, wherein the second number falls in the range of 1 to less than the first number.

In accordance with an embodiment of the presently disclosed subject matter, there is further provided a system, further comprising a first number of down converter modules configured to generate the array antenna element analog signals.

In accordance with an embodiment of the presently disclosed subject matter, there is yet further provided a system, wherein the second number being 1.

In accordance with an aspect of the presently disclosed subject matter, there is yet further provided a system for receiving signals from an array antenna that includes a first number of antenna elements, comprising a different frequencies generator module configured to generate the first number of different frequency signals each shifted by a given extent relative to a neighboring frequency signal, covering collectively a given frequency bandwidth; first number multipliers each configured to receive a respective array antenna element analog signal and a respective frequency signal of the first number of frequency signals and generate a corresponding multiplied analog signal, giving rise to a first number of multiplied analog signals extending over the given frequency bandwidth; a second number of summation modules configured to receive the first number of multiplied analog signals from the multipliers and generate a second number summed analog signals extending over the given frequency bandwidth; a second number of analog to digital converters configured to receive the summed analog signals that extend over the given frequency bandwidth and generate the second number of summed digital signals, the summed digital signals are capable of being fed to a digital processor for generating a processed signal of the array antenna, wherein the second number falls in the range of 1 to less than the first number.

In accordance with an embodiment of the presently disclosed subject matter, there is yet further provided a system, further comprising a first number of down converter modules configured to generate the array antenna element analog signals.

In accordance with an embodiment of the presently disclosed subject matter, there is yet further provided a system, further comprising a first number of filter modules each coupled to a respective multiplier such that the multiplied analog signals are each filtered to reduce interference to neighboring multiplied signals.

In accordance with an embodiment of the presently disclosed subject matter, there is yet further provided a system, wherein the second number being 1.

In accordance with an aspect off the presently disclosed subject matter, there is yet further provided a system for receiving signals from an array antenna that includes a first number of antenna elements, comprising codes generator module configured to generate the first number of different code signals each characterized by a unique code; first number multipliers each configured to receive a respective array antenna element analog signal and a respective code signal of the first number of code signals and generate a corresponding multiplied analog signal characterized by its unique code, giving rise to a first number of multiplied analog signals; a second number of summation modules configured to receive the first number of multiplied analog signals from the multipliers and generate a second number of summed analog signals; a second number of analog to digital converters configured to receive the summed analog signals and generate the second number of summed digital signals; the summed digital signals are capable of being fed to a digital processor being configured to utilize the codes for generating a processed signal of the array antenna, wherein the second number falls in the range of 1 to less than the first number.

In accordance with an embodiment of the presently disclosed subject matter, there is yet further provided a system, further comprising first number of down converter modules configured to generate the array antenna element analog signals.

In accordance with an embodiment of the presently disclosed subject matter, there is yet further provided a system, further comprising first number of filter modules each preceding a respective multiplier such that the array antenna element analog signals are being filtered.

In accordance with an embodiment of the presently disclosed subject matter, there is yet further provided a system, wherein the second number being 1.

In accordance with an embodiment of the presently disclosed subject matter, there is yet further provided a computer program product, comprising a non-transitory computer usable medium having a computer readable program code embodied therein, the computer readable program code adapted to be executed to implement a method as described below.

In accordance with an embodiment of the presently disclosed subject matter, there is yet further provided a system, wherein the array antenna is a phased array antenna.

In accordance with an aspect of the presently disclosed subject matter, there is yet provided a system for receiving signals from an array antenna that includes a first number of antenna elements, comprising:

an orthogonal signals generator module configured to generate the first number of orthogonal signals;

first number multipliers each configured to receive a respective array antenna element analog signal and a respective orthogonal signal of the first number of orthogonal signals and generate a corresponding multiplied analog signal, giving rise to a first number of multiplied analog signals;

a second number of summation modules configured to receive the first number of multiplied analog signals from the multipliers and generate a second number of summed analog signals;

a second number of analog to digital converters configured to receive the summed analog signals and generate the second number of summed digital signals;

the summed digital signals are capable of being fed to a digital processor for generating a processed signal of the array antenna, wherein the second number falls in the range of 1 to less than said first number.

In accordance with an embodiment of the presently disclosed subject matter, there is yet further provided a system, further comprising a first number of down converter modules configured to generate the array antenna element analog signals.

In accordance with an embodiment of the presently disclosed subject matter, there is yet further provided a system wherein the second number being 1.

In accordance with an aspect of the presently disclosed subject matter, there is yet further provided a system for receiving signals from an array antenna that includes a first number of antenna elements, comprising a different frequencies generator module configured to generate the first number of different frequency signals each shifted by a given extent relative to a neighboring frequency signal, covering collectively a given frequency bandwidth; first number multipliers each configured to receive a respective array antenna element analog signal and a respective frequency signal of the first number of frequency signals and generate a corresponding multiplied analog signal, giving rise to a first number of multiplied analog signals extending over the given frequency bandwidth; a second number of summation modules configured to receive the first number of multiplied analog signals from the multipliers and generate a second number of summed analog signals extending over the given frequency bandwidth; a second number of analog to digital converters configured to receive the summed analog signals that extend over the given frequency bandwidth and generate the second number of summed digital signals; the summed digital signals are capable of being fed to a digital processor for generating a processed signal of the array antenna, wherein the second number falls in the range of 1 to less than the first number.

In accordance with an embodiment of the presently disclosed subject matter, there is yet further provided a system further comprising first number of down converter modules configured to generate the array antenna element analog signals.

In accordance with an embodiment of the presently disclosed subject matter, there is yet further provided a system further comprising first number of filter modules each coupled to a respective multiplier such that the multiplied analog signals are each filtered to reduce interference to neighboring multiplied signals.

In accordance with an embodiment of the presently disclosed subject matter, there is yet further provided a system wherein the second number being 1.

In accordance with an aspect of the presently disclosed subject matter, there is yet further provided a system for receiving signals from an array antenna that includes a first number of antenna elements, comprising codes generator module configured to generate the first number of different code signals each characterized by a unique code;

first number multipliers each configured to receive a respective array antenna element analog signal and a respective code signal of the first number of code signals and generate a corresponding multiplied analog signal characterized by its unique code, giving rise to a first number of multiplied analog signals;

a second number of summation modules configured to receive the first number of multiplied analog signals from the multipliers and generate a second number summed analog signals;

a second number of analog to digital converters configured to receive the summed analog signals and generate the second number of summed digital signals;

the summed digital signals are capable of being fed to a digital processor being configured to utilize the codes for generating a processed signal of the array antenna, wherein the second number falls in the range of 1 to less than the first number.

In accordance with an embodiment of the presently disclosed subject matter, there is yet further provided a system, further comprising first number of down converter modules configured to generate the array antenna element analog signals.

In accordance with an embodiment of the presently disclosed subject matter, there is yet further provided a system further comprising first number of filter modules each preceding a respective multiplier such that the array antenna element analog signals are filtered.

In accordance with an embodiment of the presently disclosed subject matter, there is yet further provided a system wherein the second number being 1.

In accordance with an embodiment of the presently disclosed subject matter, there is yet further provided a system wherein the array antenna is a phased array antenna.

In accordance with an aspect of the presently disclosed subject matter, there is yet further provided a method for receiving signals from an array antenna that includes a first number of antenna elements, comprising generating the first number of orthogonal signals;

receiving a respective array antenna element analog signal and a respective orthogonal signal of the first number of orthogonal signals and generating a corresponding multiplied analog signal, giving rise to a first number of multiplied analog signals;

receiving, by a second number of summation modules, the first number of multiplied analog signals and generating a second number of summed analog signals;

receiving the summed analog signals and generating the second number of summed digital signals;

wherein the summed digital signals are capable of being digitally processed for generating a processed signal of the array antenna, and wherein the second number falls in the range of 1 to less than the first number.

In accordance with an aspect of the presently disclosed subject matter, there is yet further provided a method for receiving signals from an array antenna that includes a first number of antenna elements, comprising generating said first number of different frequency signals each shifted by a given extent relative to a neighboring frequency signal, covering collectively a given frequency bandwidth;

receiving a respective array antenna element analog signal and a respective frequency signal of the first number of frequency signals and generating a corresponding multiplied analog signal, giving rise to a first number of multiplied analog signals extending over said given frequency bandwidth;

receiving, by a second number of summation modules, the first number of multiplied analog signals and generating a second number of summed analog signals extending over the given frequency bandwidth;

receiving the summed analog signals that extend over the given frequency bandwidth and generating the second number of summed digital signals;

wherein the summed digital signals are capable of being digitally processed for generating a processed signal of the array antenna, and wherein the second number falls in the range of 1 to less than the first number.

In accordance with an aspect of the presently disclosed subject matter, there is yet further provided a method for receiving signals from an array antenna that includes a first number of antenna elements, comprising:

generating the first number of different code signals each characterized by a unique code;

receiving a respective array antenna element analog signal and a respective code signal of the first number of code signals and generating a corresponding multiplied analog signal characterized by its unique code, giving rise to a first number of multiplied analog signals;

receiving. by a second number of summation modules, the first number of multiplied analog signals and generating a second number summed analog signals;

receiving the summed analog signals and generating the second number of summed digital signals;

wherein the summed digital signals are capable of being digitally processed to utilize the codes for generating a processed signal of the array antenna, and wherein the second number falls in the range of 1 to less than the first number.

In accordance with an embodiment of the presently disclosed subject matter, there is yet further provided a computer program product, comprising a non-transitory computer usable medium having a computer readable program code embodied therein, the computer readable program code adapted to be executed to implement the aforementioned methods.

In accordance with an aspect of the presently disclosed subject matter, there is yet further provided a system for receiving signals from an array antenna that includes a first number of antenna elements, comprising:

an array Mux that includes an orthogonality generator configured to generate a first number of manipulated signals that have a reduced interference one to each other coupled to a second number of summation modules;

the array Mux is configured to receive a respective array antenna element analog signal and utilizing the first number of manipulated signals and the second number of summation modules to generate a second number of summed analog signals;

a second number of analog to digital converters configured to receive the summed analog signals and generate the second number of summed digital signals;

the summed digital signals are capable of being fed to a digital processor for generating a processed signal of the array antenna;

the second number falls in the range of 1 to less than the first number, thereby reducing the power consumption of the system compared to a system for receiving signals from an array antenna that includes a first number of antenna elements which utilizes a first number of analog to digital converters each directly or indirectly coupled to a respective antenna element.

In accordance with an embodiment of the presently disclosed subject matter, there is yet further provided a system wherein the first number of manipulated signals being different frequency signals each shifted by a given extent relative to a neighboring frequency signal.

In accordance with an embodiment of the presently disclosed subject matter, there is yet further provided a system wherein the first number of manipulated signals generate different code signals each characterized by a unique code.

In accordance with an embodiment of the presently disclosed subject matter, there is yet further provided a system wherein the generated processed signals are utilized for Digital Beam Forming (DBF).

In accordance with an embodiment of the presently disclosed subject matter, there is yet further provided a system wherein said generated processed signal are utilized for Digital Beam Forming (DBF).

In accordance with an embodiment of the presently disclosed subject matter, there is yet further provided a system wherein the generated processed signal are utilized for Digital Beam Forming (DBF).

In accordance with an embodiment of the presently disclosed subject matter, there is yet further provided a system wherein the generated processed signals are utilized for Beam steering.

In accordance with an embodiment of the presently disclosed subject matter, there is yet further provided a system wherein the generated processed signals are utilized for Beam steering.

In accordance with an embodiment of the presently disclosed subject matter, there is yet further provided a system wherein the generated processed signals are utilized for Beam steering.

In accordance with an embodiment of the presently disclosed subject matter, there is yet further provided a system wherein the generated processed signal are utilized for MVDR.

In accordance with an embodiment of the presently disclosed subject matter, there is yet further provided a system, wherein the generated processed signals are utilized for MVDR.

In accordance with an embodiment of the presently disclosed subject matter, there is yet further provided a system wherein the generated processed signals are utilized for MVDR.

In accordance with an embodiment of the presently disclosed subject matter, there is yet further provided a system for receiving signals from an array antenna further comprising:

a divider module configured to receive the second number of summed digital signals and divide them into a first number of digitally divided signals each corresponding to a respective array antenna element analog signal of an antenna element of the array of antenna elements;

a different frequencies generator digital module configured to generate the first number of different frequency digital signals each shifted by a given extent relative to a neighboring frequency digital signal, covering collectively a given frequency bandwidth;

first number digital multipliers each configured to receive a respective digitally divided signal of the digitally divided signals and a respective frequency digital signal of the first number of frequency digital signals, and generate a corresponding multiplied digital signal, giving rise to a first number of multiplied digital signals extending over the given frequency bandwidth; and a digital processor configured to receive the first number of multiplied digital signals for generating a processed signal of the array antenna.

In accordance with an embodiment of the presently disclosed subject matter, there is yet further provided a system for receiving signals from an array antenna further comprising:

a divider module configured to receive the second number of summed digital signals and divide them into a first number of digitally divided signals each corresponding to a respective array antenna element analog signal of an antenna element of the array of antenna elements;

codes generator digital module configured to generate the first number of different code digital signals each characterized by a unique code;

first number digital multipliers, each configured to receive a respective digitally divided signal of the digitally divided signals and a respective code digital signal of the first number of code digital signals, and generate a corresponding multiplied digital signal characterized by its unique code, giving rise to a first number of multiplied digital signals; and a digital processor configured to receive the first number of multiplied digital signals for generating a processed signal of the array antenna.

BRIEF DESCRIPTION OF THE DRAWINGS

Certain embodiments of the present invention are illustrated in the following non-limiting drawings:

FIGS. 4a and 4b is a simplified block diagram illustration of the array mux.

FIGS. 12a and 12b presents frequency domain illustration of the signals along the processing chain of the array mux for frequency domain multiplexing.

FIGS. 13a and 13b present frequency domain illustration of the signals along the processing chain of the array mux for code domain multiplexing.

DETAILED DESCRIPTION OF CERTAIN EMBODIMENTS

Figure 1:
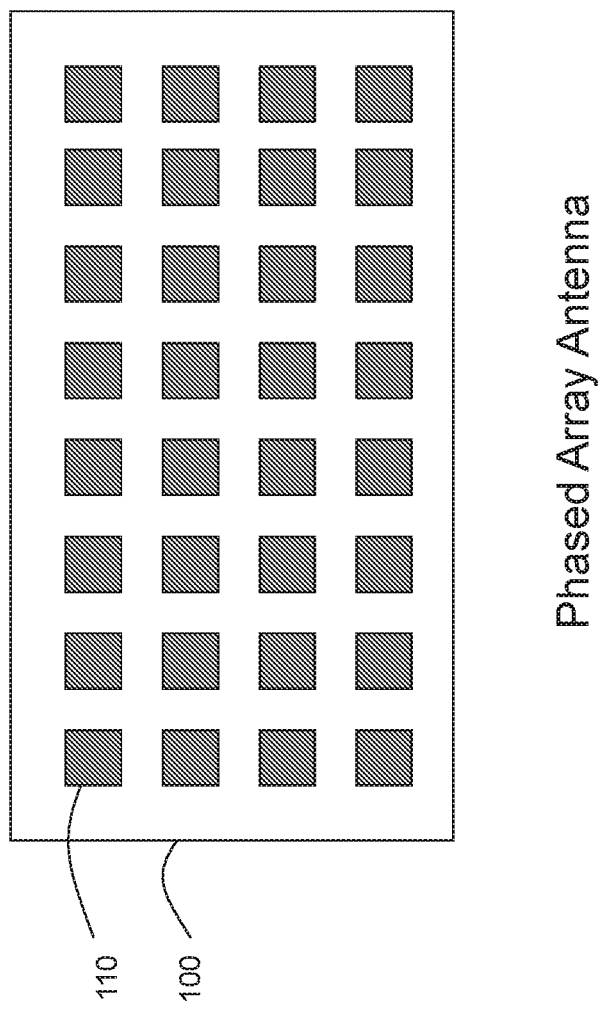
FIG. 1 is a simplified block diagram of receive antenna array.
Figure 2:
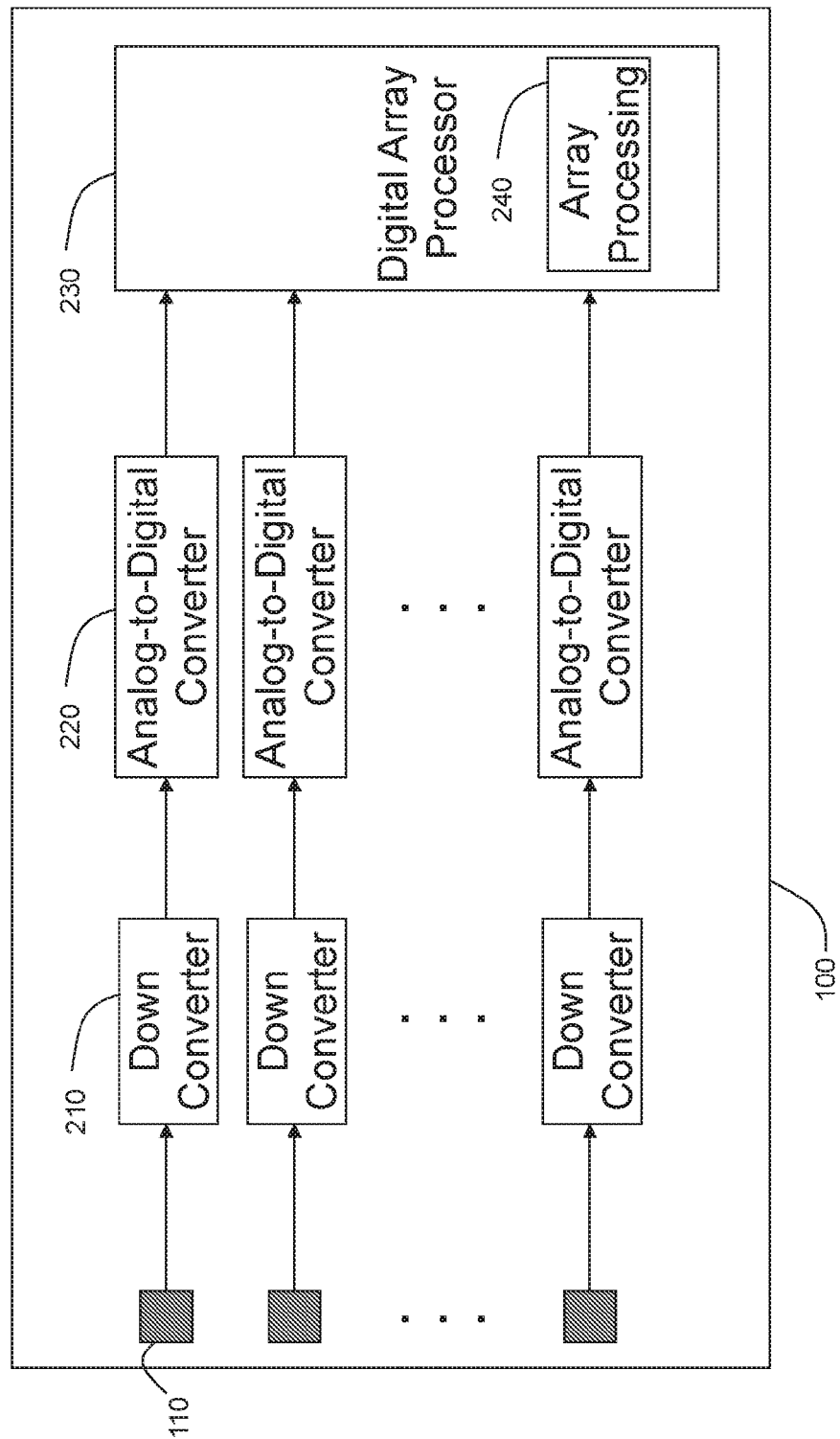
FIG. 2 is a simplified block diagram of receive antenna array internal processing chain.
Figure 3:
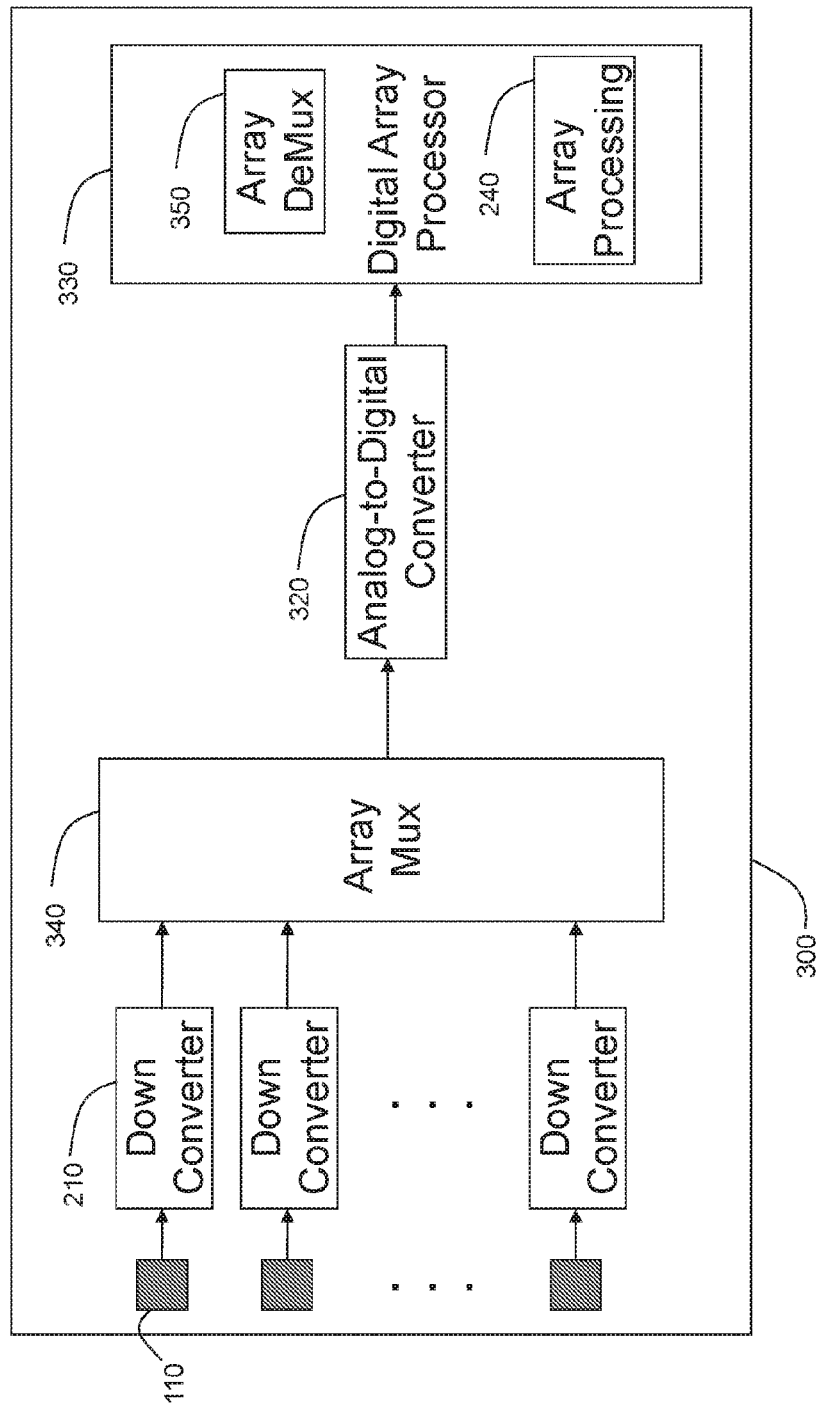
FIG. 3 is a simplified block diagram of receive antenna array internal processing chain including array signals multiplexing.

FIG. 3 is a simplified block diagram of the receive antenna array internal processing chain including array signals multiplexing. The signals received by the array antenna elements are optionally down converted by a down-converter 210 from the RF frequency to IF or base-band frequency, as described above. After the down-conversion, the signals are then provided to the array mux 340. Optionally the system can be implemented without down-converters 210 where the signals received by the array antenna elements are fed directly to the array mux 340. The array mux 340 is able to manipulate all its input signals so as to make a unified signal (or signals) that is fed into a single ADC 320 (or a plurality of ADCs, as so that its quantity is less than the number of antenna elements). The ADC 320 converts the unified multi-channel signal (or signals) from the analog domain to the digital domain (also known as sampling). Thereafter the digital signal is fed to the digital array processor 330. The digital array processor may have an additional component—array demux 350, in order to de-manipulate the unified digital signal to a plurality of separate signals corresponding to the plurality of analog signals at the beginning of the array mux 340.

According to an embodiment of present invention, different array antenna elements 110 correspond to different polarizations of elements or to a single element having several polarized outputs (i.e. vertical linear, horizontal linear, slanted linear, right-hand circular, left-hand circular or elliptic polarizations).

Figure 4B:
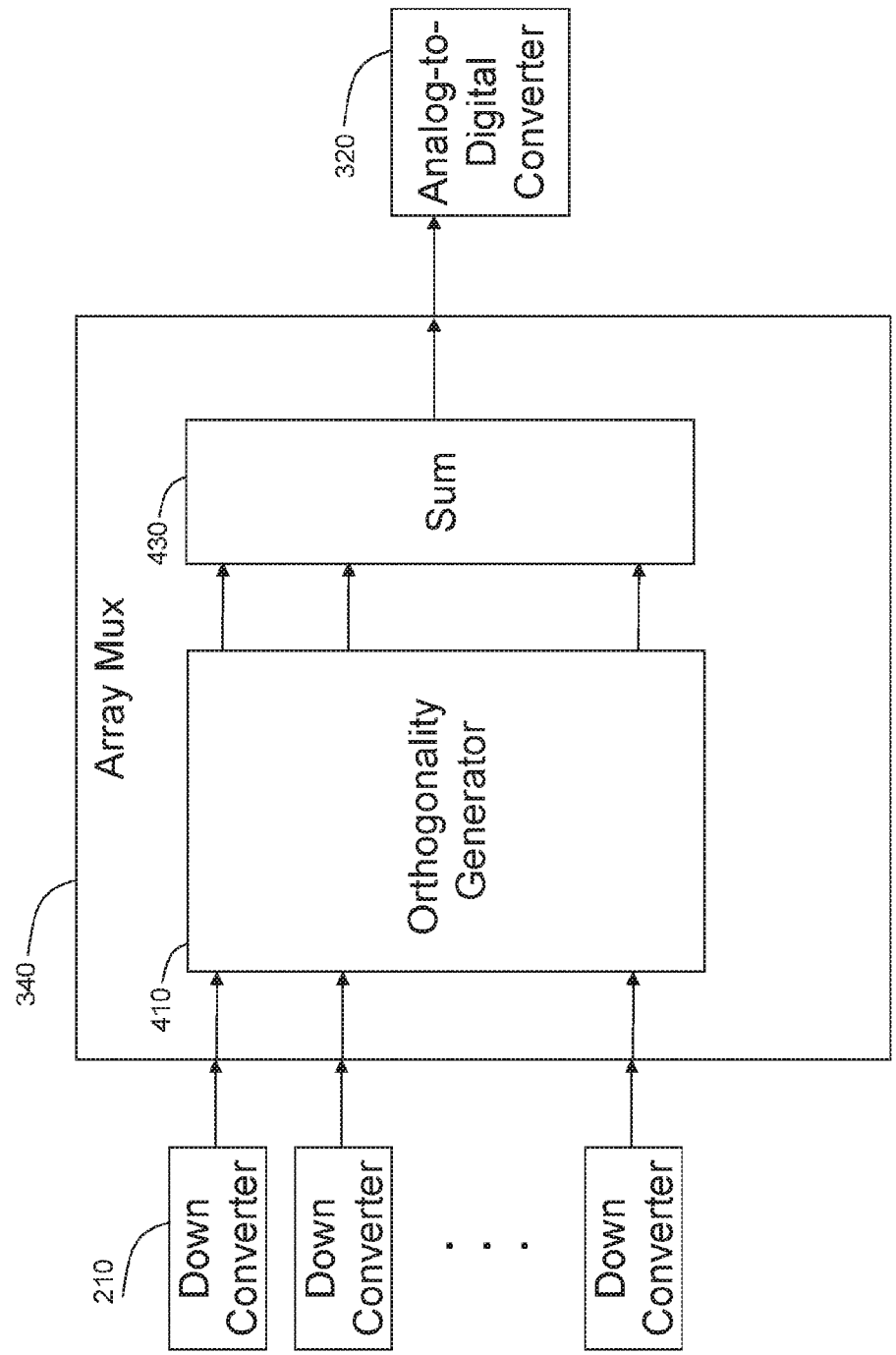

FIGS. 4a and 4b are simplified block diagram illustrations of the array mux. According to an embodiment of present invention, the array mux 340 comprises orthogonality generator 410 and a summing module (Sum) 430. The orthogonality generator 410 is able to manipulate each one of its input analog signals so as to make each one of them orthogonal (or semi-orthogonal or partly-orthogonal or with good/low cross-correlation) to the other input signals. Because of this full or partial orthogonality, the summing module 430, which sums all the output signals of the orthogonality generator 410, converts separate inputs to a single (or several) outputs having a sum of different manipulated signals that have a reduced interference one to each other. Thereafter the single (or several) output of the summing module is fed to a single ADC (or several ADCs). FIG. 4a shows one example in which the inputs of the orthogonality generator are the outputs of the array antenna elements. FIG. 4b shows an additional example in which the inputs of the orthogonality generator are the outputs of down-converters.

Figure 5:
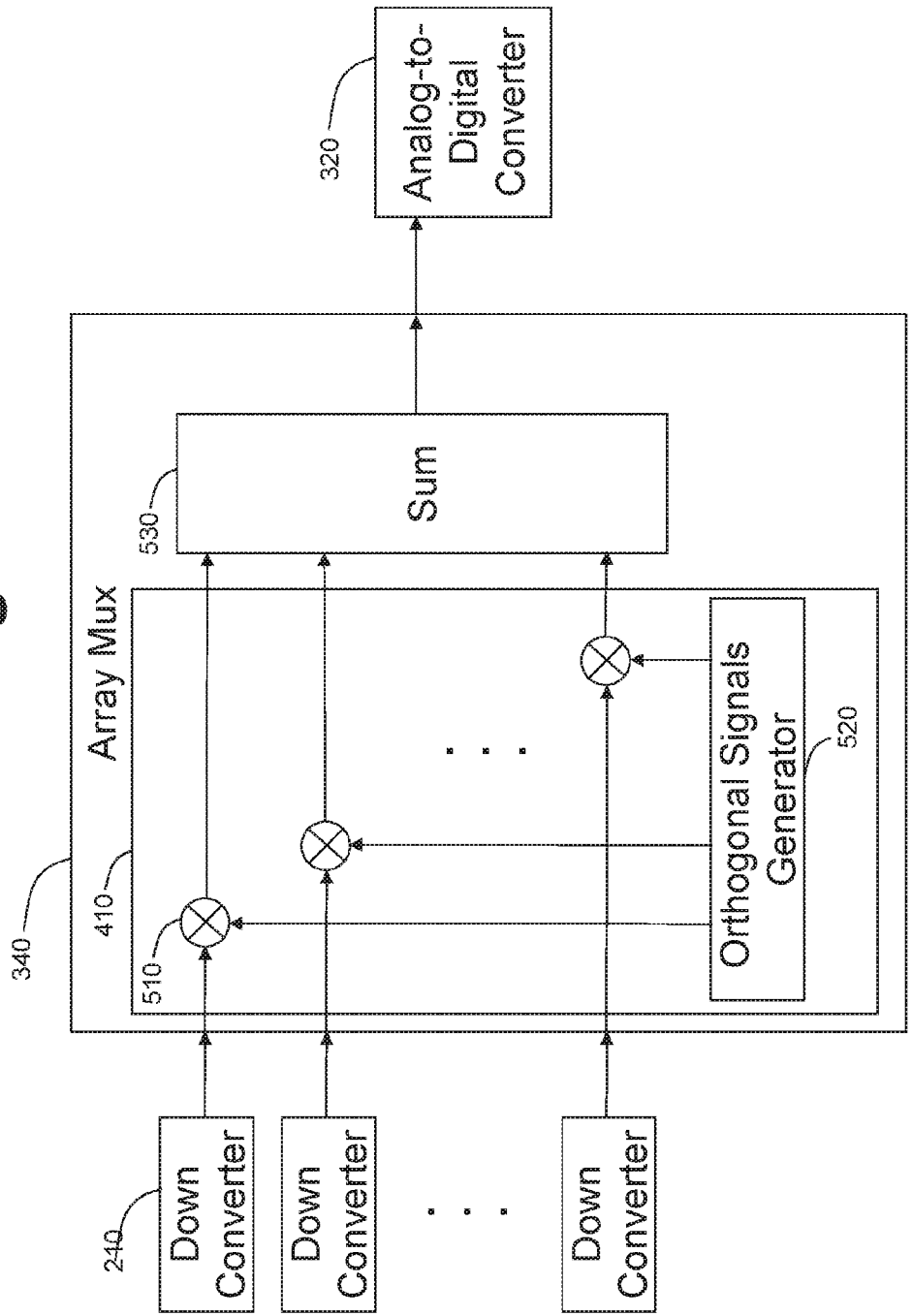
FIG. 5 is simplified block diagram example of internal components of the array mux.

FIG. 5 is simplified block diagram example of internal components of the array mux according to an embodiment of present invention. This figure illustrates an example of the internal components of the orthogonality generator 410. The orthogonality generator 410 inputs are fed to a set of multipliers 510 (i.e. analog mixers), each having its second input from orthogonal signals generator 520. The outputs of the multipliers are then fed into the summing module 530 as described above. The orthogonal signal generator optionally generates a set of orthogonal signals, corresponding to the number of inputs to the orthogonality generator 410 and/or to the number of multipliers 510. The multiplication executed by the multipliers 510 of each input signal (arriving originally from different element of the antenna) with one of the orthogonal signals results in a set of multiplied orthogonal signals (at the outputs of the multipliers) that have reduced interference, one with respect to the other.

Figure 6:
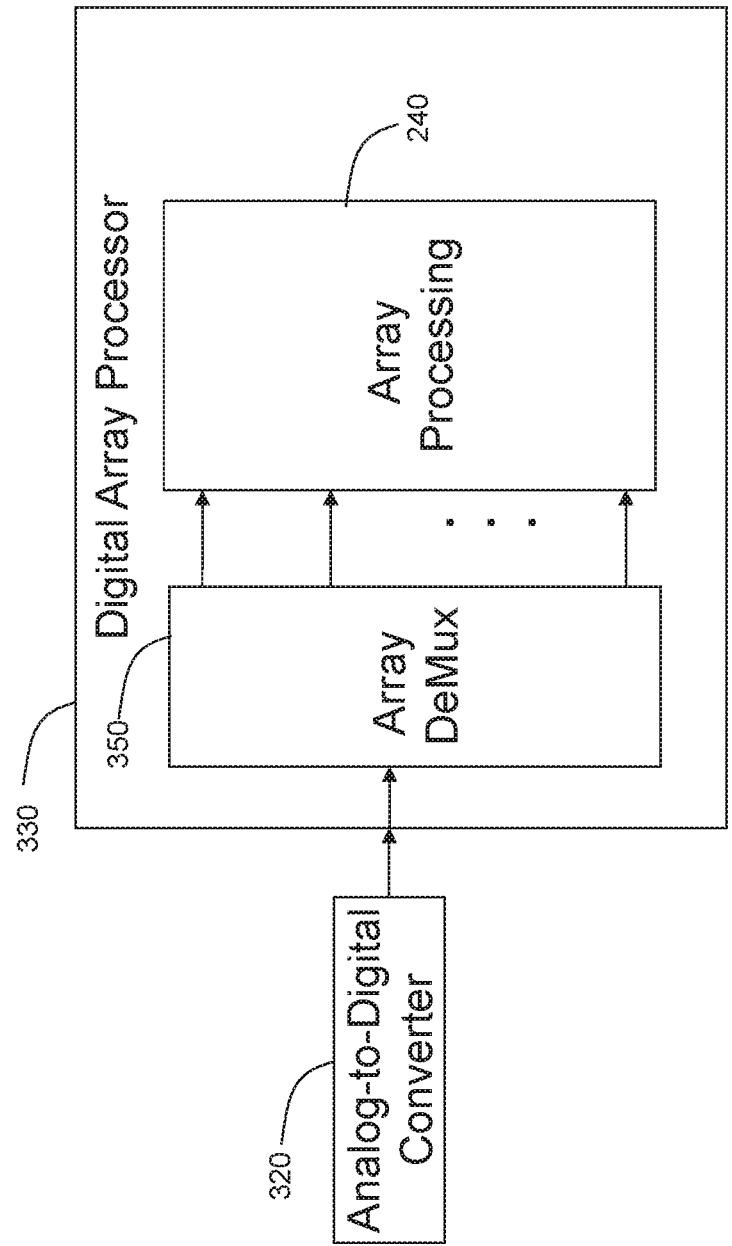
FIG. 6 is a simplified block diagram illustration of digital array processor comprising an array demux.

FIG. 6 is a simplified block diagram illustration example of digital array processor 330 comprising array demux 350. The digital output of the ADC 320 (or several ADCs) is fed to the array demux. The array demux 350 executes de-manipulation of the unified digital signal so as to separate it to different digital signals corresponding to the different antenna elements.

Figure 7:
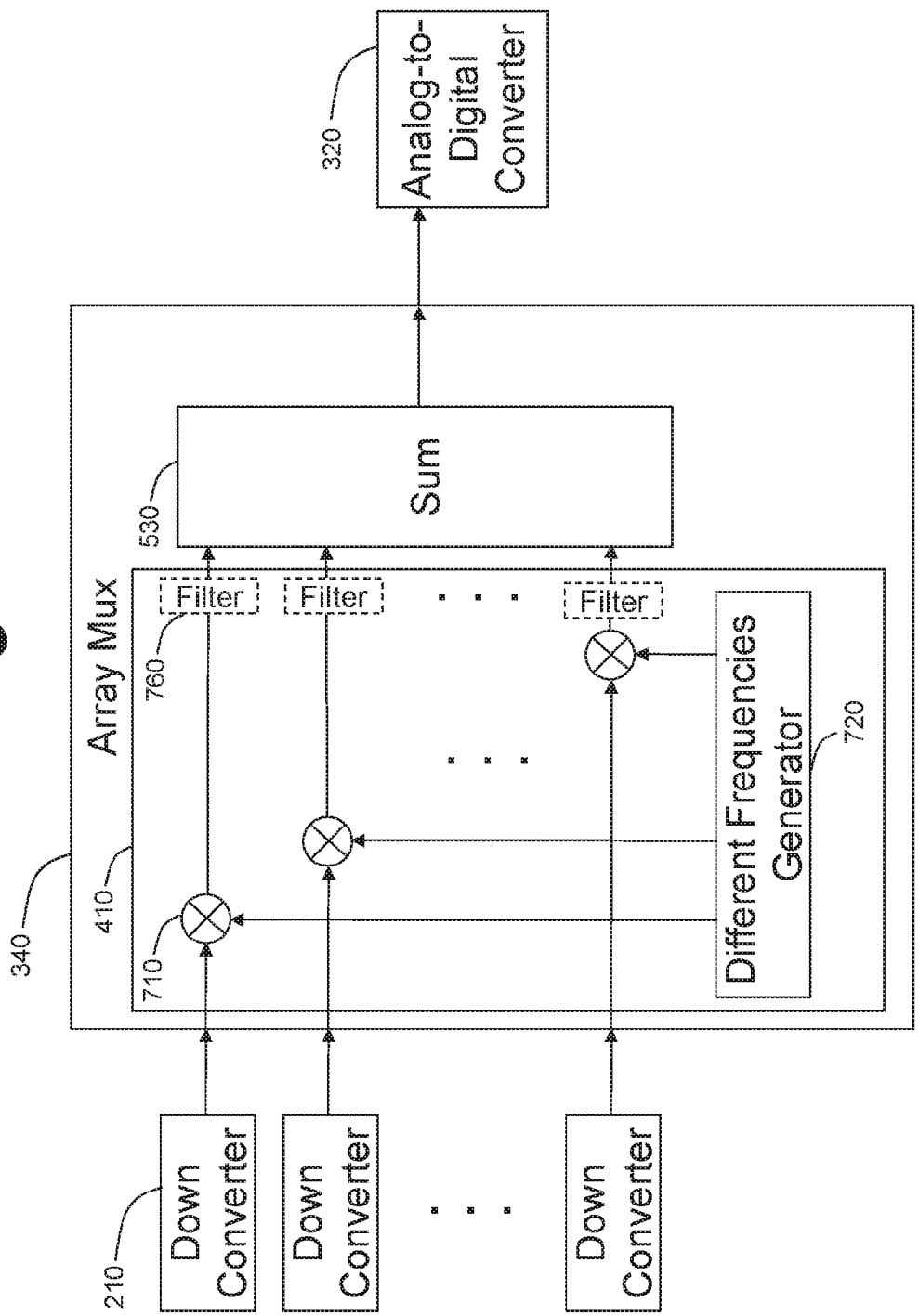
FIG. 7 is simplified block diagram example of internal components of the array mux for frequency domain multiplexing.
Figure 12A:
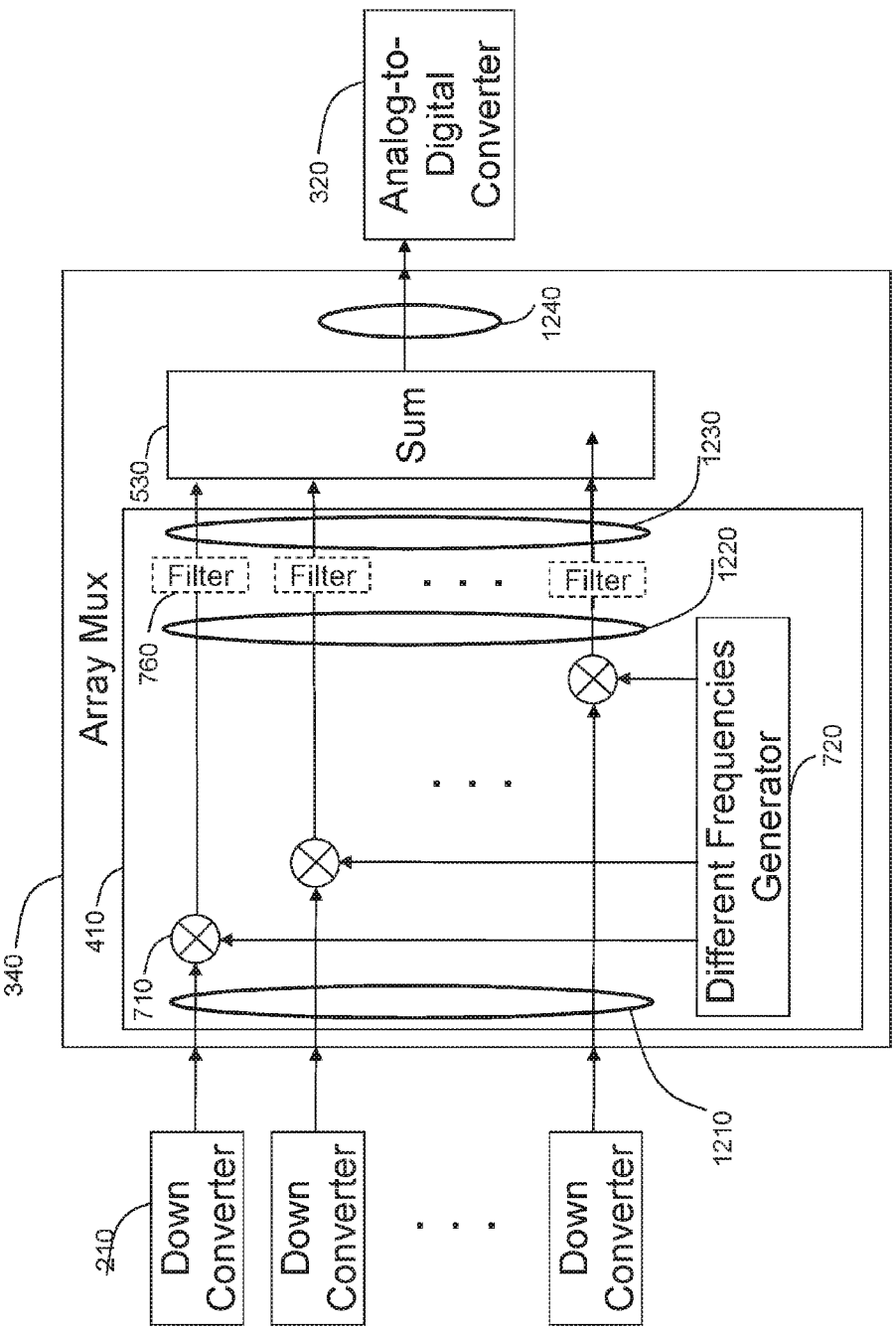

FIG. 7 is simplified block diagram example of internal components of the array mux 340 for frequency domain multiplexing according to an embodiment of present invention. FIGS. 12a and 12b present frequency domain illustrations of the signals along the processing chain of the array mux 340 for frequency domain multiplexing according to an embodiment of present invention. The inputs (1210 in FIG. 12) to the array mux 340 can be the outputs of the array antenna elements or the outputs [1210 in FIG. 12] of the down-converters 210 (as presented as an example in FIG. 7). These outputs [1210 in FIG. 12] of the down-converters 210 (or antenna elements) typically/alternatively have the same center frequency and occupy the same bandwidth (as shown in 1210 at FIG. 12b), and in this example are fed to analog mixers 710. Each analog mixer 710 has two inputs—one from the output of a down-converter 210 (or antenna element) and the other from the different frequencies generator 720. The different frequencies generator 720 generates a set of continuous-wave (CW) signals, each in different frequency (i.e. a set of sin and/or cosine signals each one in different frequency). In this implementation, the analog mixer 710 implements frequency conversion of each one of the inputs signals (inputs to the orthogonality generator) to a different converted/multiplied analog signal (1220 in FIG. 12). Typically (for example) the usable bandwidth of each one of the multiplied analog signals is non-overlapping any other multiplied analog signals (as can be seen at 1220 in FIG. 12b). Thereafter, optionally, the outputs of the analog mixers 710 are fed to filters 760 (i.e. band-pass filter) in order to reduce the unwanted signals (typically in frequencies not usable to the system) which may be created by the analog mixers or and other components in the preceding receiving chain or may be part of the original signal that is not being used by the system. After the optional filters 760 the filtered, multiplied analog signals (1230 in FIG. 12) are more "clean" and have reduced side-lobes/envelope in the frequency domain so as to reduce the adjacent channel interference (ACI) between the different filtered multiplied analog signals 1230. Thereafter the filtered multiplied analog signals 1230 are fed to summing module 530 that sum all these signals to a single unified analog signal 1240 having all the corresponding analog signals of the array antenna elements 110 multiplexed in the frequency domain. Typically the unified bandwidth of the unified analog signals is preferably continuous so that the sampling bandwidth of the ADC 320 that is being fed by this unified analog signal, is feasible (and as narrow as possible in order to reduce complexity and power consumption). Typically, in this frequency, domain multiplexing the bandwidth of the ADC is a linear function (i.e. sum) of the usable bandwidth of an antenna element.

Figure 8:
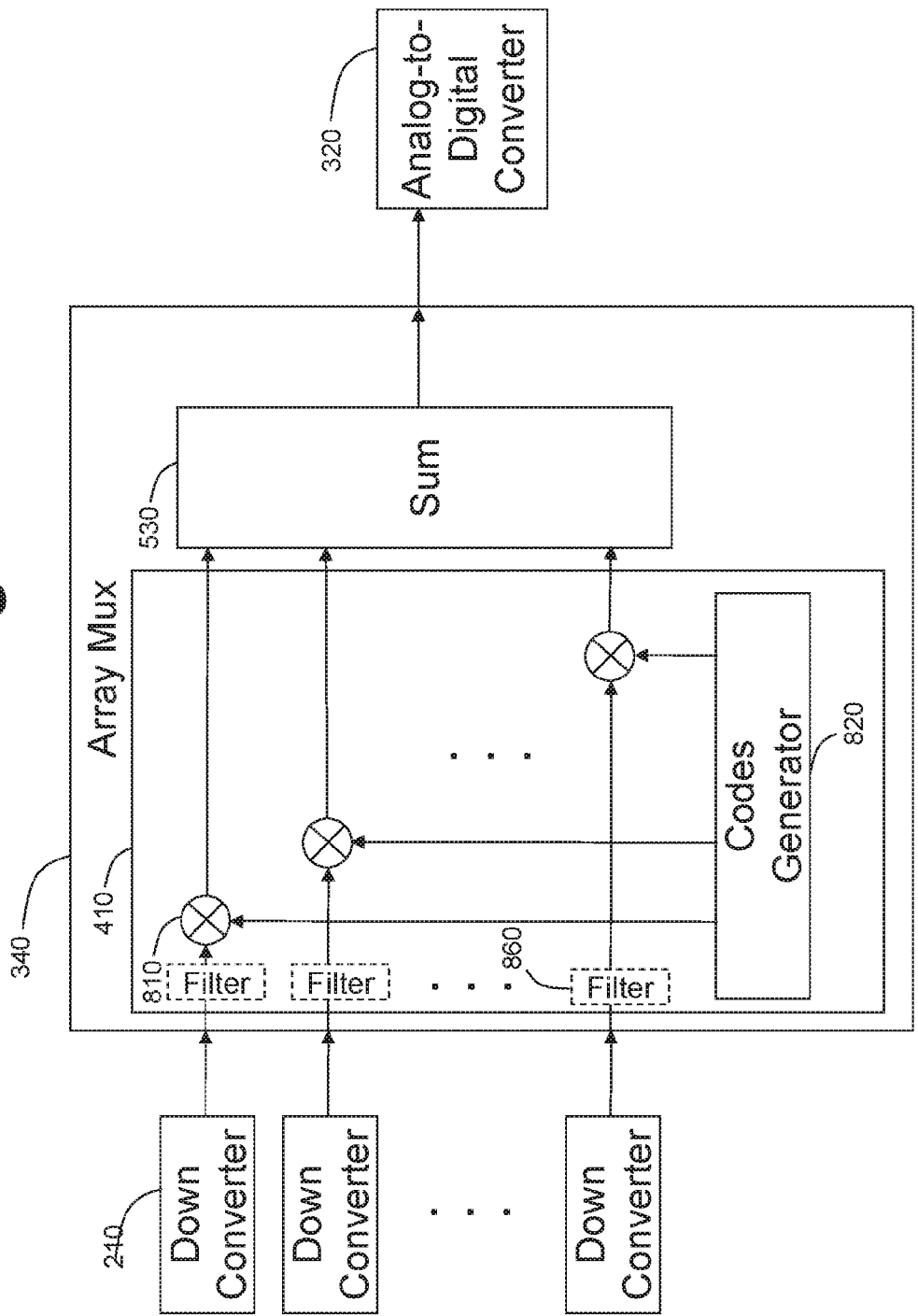
FIG. 8 is simplified block diagram example of internal components of the array mux for code domain multiplexing.
Figure 10:
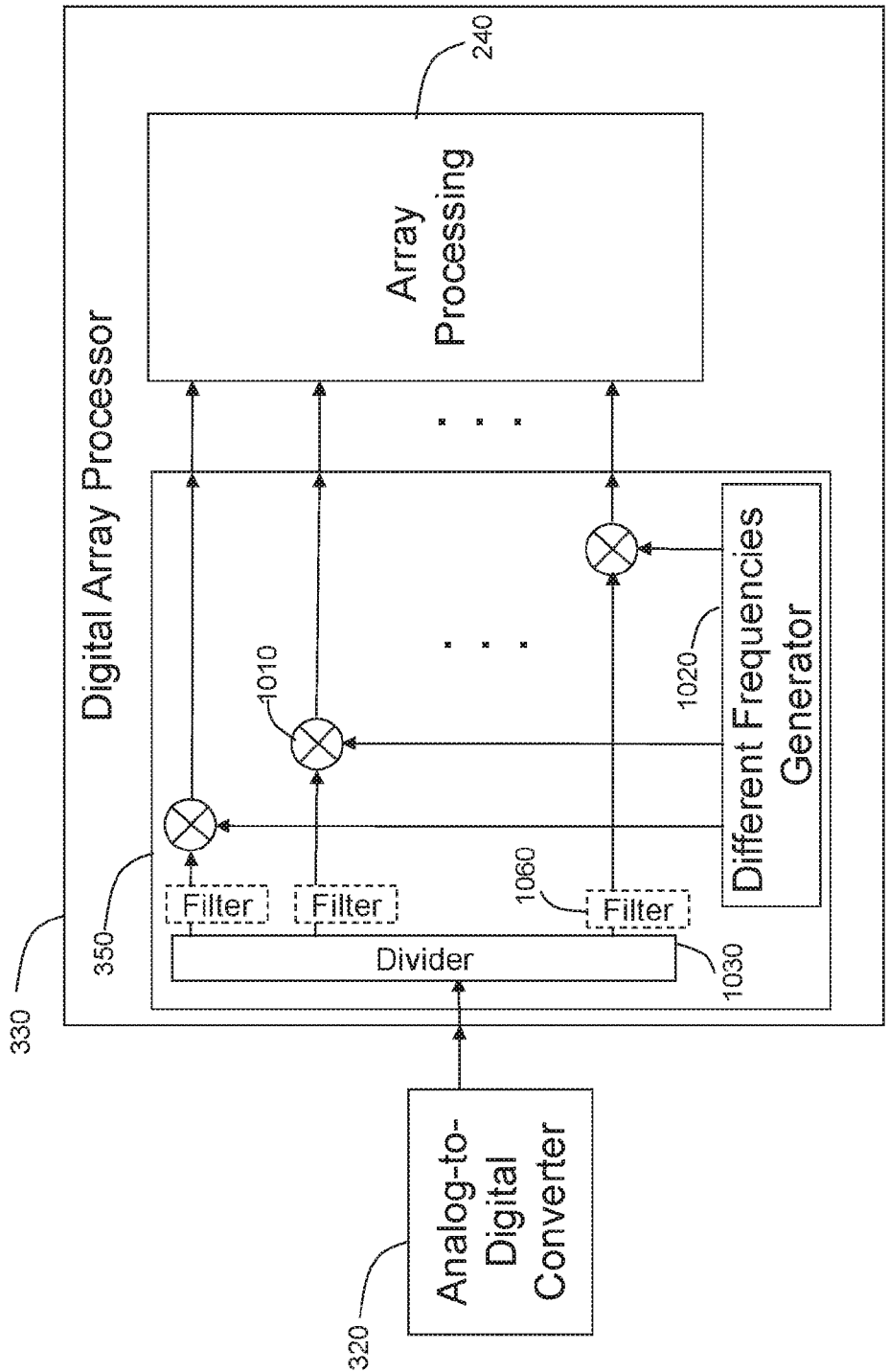
FIG. 10 is simplified block diagram example of internal components of the digital array processor for frequency domain multiplexing.

FIG. 10 is simplified block diagram example of internal components of the digital array processor 330 for frequency domain multiplexing. It can be seen that the processing chain of the array demux 350 is adequate to the corresponding array mux 340, but in reverse order. First the input is fed to a divider 1030 which divides digitally the single inputs to different outputs (i.e. as the number of antenna array elements 110), these outputs are fed to filters 1060, whose outputs are fed to multipliers 1010 having second inputs from different frequencies generator 1020 generating signals (as described in FIG. 7) corresponding to the different frequencies generator 1020, so that the output of the multiplier is a set of digital signals having the same center frequency. Alternatively no multiplication can be used, and the digital processing can be executed on the unified digital signal (i.e. IF sampling and processing). The implementation of the array demux is performed, typically, entirely in a digital manner. FIG. 8 is simplified block diagram example of internal components of the array mux 340 for code domain multiplexing according to an embodiment of present invention. FIGS. 13a and 13b present a frequency domain illustration of the signals along the processing chain of the array mux 340 for code domain multiplexing according to an embodiment of present invention. The inputs [1310 in FIG. 13] to the array mux 340 can be the outputs of the array antenna elements or the outputs [1310 in FIG. 12] of the down-converters 210 (as presented as an example in FIG. 8). These outputs [1310 in FIG. 12] of the down-converters 210 (or antenna elements) typically/alternatively have the same center frequency and occupy the same bandwidth (as shown in 1310 at FIG. 13).

Thereafter, optionally, the outputs of the of the down-converters 210 are fed to filters 860 (i.e. band-pass filter) in order to reduce the unwanted signals (typically in frequencies not usable to the system) which may be created by other components in the preceding receiving chain or may be part of the original signal that is not being used by the system. After the optional filters 860 the filtered multiplied analog signals (1320 in FIG. 13) are more "clean" and have reduce side-lobes/envelope in the frequency domain so as to reduce the adjacent channel interference (ACI) between the different filtered multiplied analog signals 1320. Thereafter, the filtered multiplied analog signals 1320 are fed to analog mixers 810. Each analog mixer 810 has two inputs—one from the output of a down-converter 210 (or antenna element) and the other from the codes generator 820. The codes generator 820 generates a set of orthogonal codes (or semi-orthogonal codes) signals, each being different from the other (i.e. a set of Walsh/Hadamard codes or Gold codes or OVSF [orthogonal variable spreading factor] codes). In this implementation, the analog mixer 810 implements code multiplication of each one of the inputs signals (inputs to the orthogonality generator 340) to a different coded analog signal (1330 in FIG. 13). Typically (for example) the usable bandwidth of each one of the multiplied analog signals overlaps the other multiplied analog signals (as can be seen at 1330 in FIG. 13). The bandwidth of the coded analog signals may be wider than the received analog signals so as to achieve processing gain in order to increase the orthogonality (i.e. cross-correlation) between the multiplied/coded analog signals 1330. The outputs of the multipliers are then fed to summing module 530 that sum all these signals to a single unified analog signal 1340 having all the corresponding analog signals of the array antenna elements 110 multiplexed in the code domain. Typically, the unified bandwidth of the unified analog signals is preferably the same as each of the multiplied/coded analog signals 1340 so that the sampling bandwidth of the ADC 320 that is being fed by this unified analog signal, is feasible, and is the same as each one of the multiplied/coded analog signals 1340. This implementation is very attractive and efficient in system complexity and power consumption.

Figure 11:
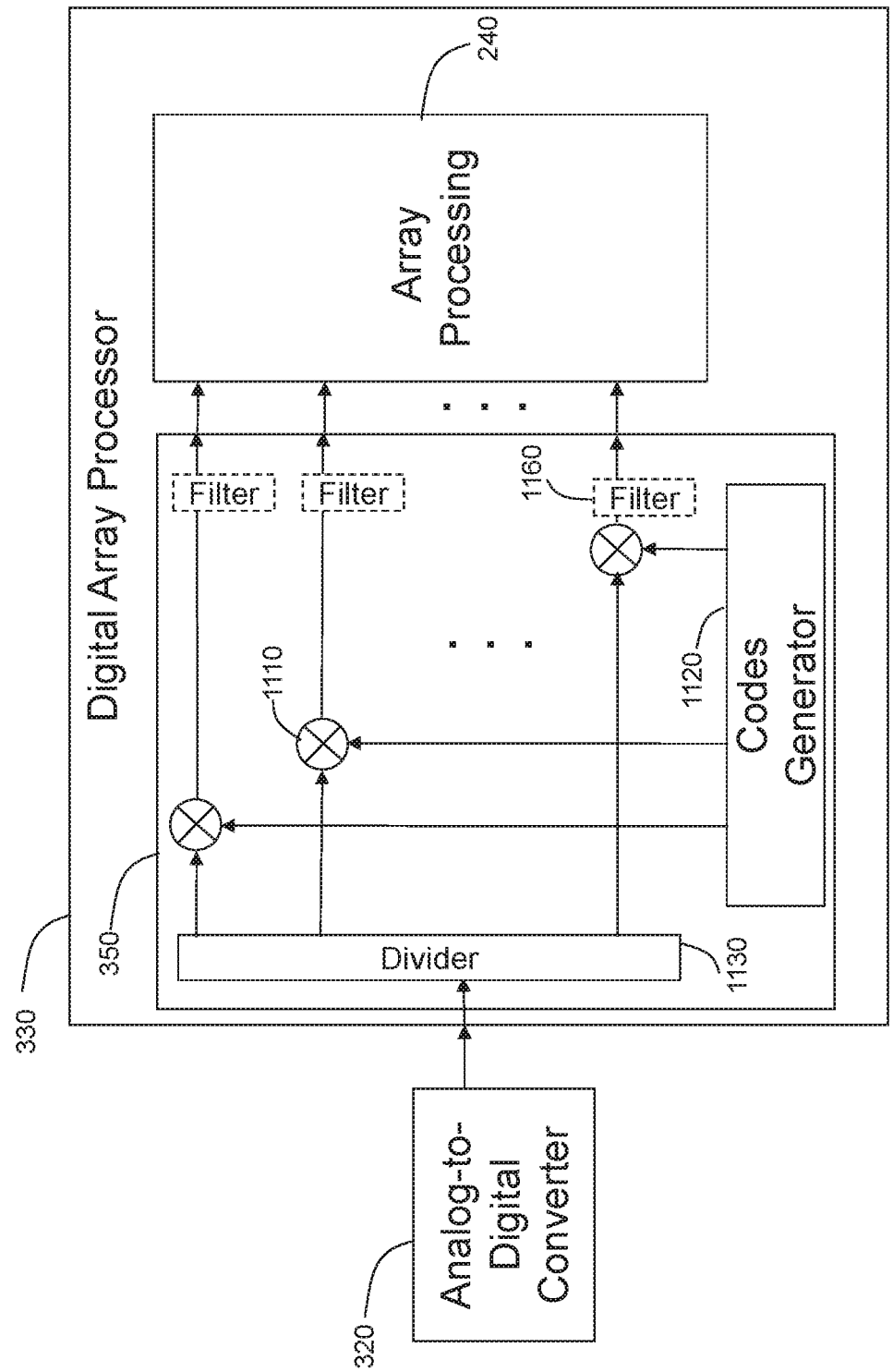
FIG. 11 is simplified block diagram example of internal components of the digital array processor for code domain multiplexing.

FIG. 11 is a simplified block diagram example of internal components of the digital array processor for code domain multiplexing. It can be seen that the processing chain of the array demux 350 is adequate to the corresponding array mux 340, but in reverse order. First, the input is fed to a divider 1130 which divides digitally the single inputs to different outputs (i.e. as the number of antenna array elements 110). These outputs are fed to multipliers 1110 having second inputs from codes generator 1120 generating signals (as described in FIG. 8) corresponding to the codes generator 1120, so that the output of the multiplier is a set of digital signals having the same center frequency. Alternatively no multiplication can be used and the digital processing can be executed on the unified digital signal. The implementation of the array demux is performed typically entirely in an digital manner. Optionally, the outputs of the multipliers can be fed to filters 1060 for better and narrower digital processing at the array processing 240.

Figure 9:
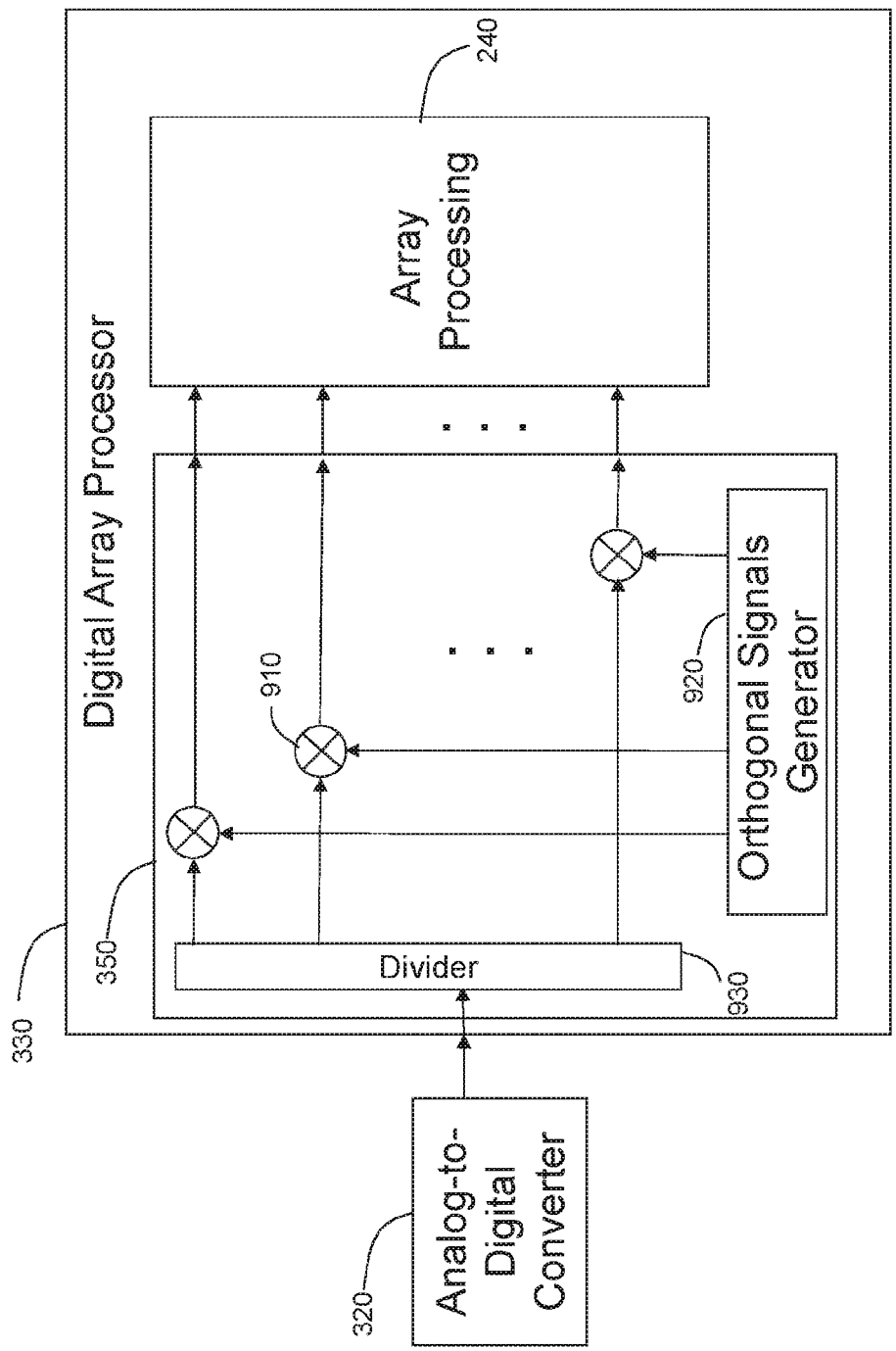
FIG. 9 is simplified block diagram example of internal components of the digital array processor.

FIG. 9 is simplified block diagram example of internal components of the digital array processor.

Computational components described and illustrated herein can be implemented in various forms, for example, as hardware circuits such as but not limited to custom VLSI circuits or gate arrays or programmable hardware devices such as but not limited to FPGAs, or as software program code stored on at least one intangible computer readable medium and executable by at least one processor, or any suitable combination thereof. A specific functional component may be formed by one particular sequence of software code, or by a plurality of such, which collectively act or behave or act as described herein with reference to the functional component in question. For example, the component may be distributed over several code sequences such as but not limited to objects, procedures, functions, routines and programs, and may originate from several computer files which typically operate synergistically.

Data can be stored on one or more intangible computer readable media stored at one or more different locations, different network nodes or different storage devices at a single node or location.

It is appreciated that any computer data storage technology, including any type of storage or memory and any type of computer components and recording media that retain digital data used for computing for an interval of time, and any type of information retention technology, may be used to store the various data provided and employed herein. Suitable computer data storage or information retention apparatus may include apparatus which is primary, secondary, tertiary or off-line; which is of any type or level or amount or category of volatility, differentiation, mutability, accessibility, addressability, capacity, performance and energy use; and which is based on any suitable technologies such as semiconductor, magnetic, optical, paper and others.

It is appreciated that a single big antenna array having many antenna elements may be treated as a set of plurality of groups of big single antenna elements. Each of these groups of elements can be seen as a separate antenna array having less elements than a big antenna array, and each group may have a single ADC as described in the previous figures, so that the big antenna array will have totally more than one, but less than the big antenna array elements' number of analog-to-digital converters (ADCs) and may implement several antenna array receiving chains, as illustrated for example in FIG. 3 (i.e. having several systems as presented in FIG. 3 in a single big antenna array).

It is appreciated that terminology such as "mandatory", "required", "need" and "must" refer to implementation choices made within the context of a particular implementation or application described herewithin for clarity and are not intended to be limiting since in an alternative implantation, the same elements might be defined as not mandatory and not required or might even be eliminated altogether.

It is appreciated that software components of the present invention including programs and data may, if desired, be implemented in ROM (read only memory) form including CD-ROMs, EPROMs and EEPROMs, or may be stored in any other suitable typically non-transitory computer-readable medium such as but not limited to disks of various kinds, cards of various kinds and RAMs. Components described herein as software may, alternatively, be implemented wholly or partly in hardware, if desired, using conventional techniques. Conversely, components described herein as hardware may, alternatively, be implemented wholly or partly in software, if desired, using conventional techniques.

Included in the scope of the present invention, inter alia, are electromagnetic signals carrying computer-readable instructions for performing any or all of the steps of any of the methods shown and described herein, in any suitable order; machine-readable instructions for performing any or all of the steps of any of the methods shown and described herein, in any suitable order; program storage devices readable by machine, tangibly embodying a program of instructions executable by the machine to perform any or all of the steps of any of the methods shown and described herein, in any suitable order; a computer program product comprising a computer useable medium having computer readable program code, such as executable code, having embodied therein, and/or including computer readable program code for performing, any or all of the steps of any of the methods shown and described herein, in any suitable order; any technical effects brought about by any or all of the steps of any of the methods shown and described herein, when performed in any suitable order; any suitable apparatus or device or combination of such, programmed to perform, alone or in combination, any or all of the steps of any of the methods shown and described herein, in any suitable order; electronic devices each including a processor and a cooperating input device and/or output device and operative to perform in software any steps shown and described herein; information storage devices or physical records, such as disks or hard drives, causing a computer or other device to be configured so as to carry out any or all of the steps of any of the methods shown and described herein, in any suitable order; a program pre-stored e.g. in memory or on an information network such as the Internet, before or after being downloaded, which embodies any or all of the steps of any of the methods shown and described herein, in any suitable order, and the method of uploading or downloading such, and a system including server/s and/or client/s for using such; and hardware which performs any or all of the steps of any of the methods shown and described herein, in any suitable order, either alone or in conjunction with software. Any computer-readable or machine-readable media described herein is intended to include non-transitory computer- or machine-readable media.

Any computations or other forms of analysis described herein may be performed by a suitable computerized method. Any step described herein may be computer-implemented. The invention shown and described herein may include (a) using a computerized method to identify a solution to any of the problems or for any of the objectives described herein, the solution optionally includes at least one of a decision, an action, a product, a service or any other information described herein that impacts, in a positive manner, a problem or objectives described herein; and (b) outputting the solution.

The scope of the present invention is not limited to structures and functions specifically described herein and is also intended to include devices which have the capacity to yield a structure, or perform a function, described herein, such that even though users of the device may not use the capacity, they are, if they so desire, able to modify the device to obtain the structure or function.

Features of the present invention which are described in the context of separate embodiments may also be provided in combination in a single embodiment.

For example, a system embodiment is intended to include a corresponding process embodiment. Also, each system embodiment is intended to include a server-centered "view" or client centered "view", or "view" from any other node of the system, of the entire functionality of the system, computer-readable medium, apparatus, including only those functionalities performed at that server or client or node.

Conversely, features of the invention, including method steps, which are described for brevity in the context of a single embodiment or in a certain order may be provided separately or in any suitable subcombination or in a different order. "e.g." is used herein in the sense of a specific example which is not intended to be limiting. Devices, apparatus or systems shown coupled in any of the drawings may in fact be integrated into a single platform in certain embodiments or may be coupled via any appropriate wired or wireless coupling such as but not limited to optical fiber, Ethernet, Wireless LAN, HomePNA, power line communication, cell phone, PDA, Blackberry GPRS, Satellite including GPS, or other mobile delivery. It is appreciated that in the description and drawings shown and described herein, functionalities described or illustrated as systems and sub-units thereof can also be provided as methods and steps therewithin, and functionalities described or illustrated as methods and steps therewithin can also be provided as systems and sub-units thereof. The scale used to illustrate various elements in the drawings is merely exemplary and/or appropriate for clarity of presentation and is not intended to be limiting.

In the detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

In the drawings and descriptions set forth above, identical reference numerals indicate those components that are common to different embodiments or configurations.

As used herein, the phrase "for example," "such as", "for instance" and variants thereof describe non-limiting embodiments of the presently disclosed subject matter.

It is appreciated that certain features of the presently disclosed subject matter, which are, for clarity, described in the context of separate embodiments, may also be provided in combination in a single embodiment or with other embodiment(s). Conversely, various features of the presently disclosed subject matter, which are, for brevity, described in the context of a single embodiment, may also be provided separately or in any suitable sub-combination.

In embodiments of the presently disclosed subject matter one or more stages illustrated in the figures may be executed in a different order and/or one or more groups of stages may be executed simultaneously and vice versa. The figures illustrate a general schematic of the system architecture in accordance with an embodiment of the presently disclosed subject matter. Each module in the figures can be made up of any combination of software, hardware and/or firmware that performs the functions as defined and explained herein. The modules in the figures may be centralized in one location or dispersed over more than one location.

Any of the modules in FIGS. 3-13 may be made up of any combination of software, hardware and/or firmware that performs the functions as described and explained herein. In various cases, system 200 may be centralized in one location or dispersed over more than one location.

Alternative to the example shown in FIG. 3, system 200 may in some examples include fewer, more and/or different modules than shown in FIG. 3 Alternative to the example shown in FIG. 3, the functionality of system 100 may in some examples be divided differently among the modules illustrated in FIG. 3. Alternative to the example shown in FIG. 3, the functionality of system 100 described herein may in some examples be divided into fewer, more and/or different modules than shown in FIG. 3 and/or system 100 may in some examples include additional, less, and/or different functionality than described herein.

Alternative to the examples shown in FIGS. 12 and 13, stages which are shown as being executed sequentially may in some other examples be executed in parallel and/or stages shown as being executed in parallel may in some other examples be executed sequentially. Alternative to the examples shown, some other examples include more, fewer and/or different stages than illustrated. Alternative to the examples shown, stages may in some other examples be executed in a different order than illustrated.

The term processor should be expansively construed to include any kind of one or more electronic processors with data processing capabilities and which is made up of any combination of hardware, software and/or firmware and which includes at least some hardware, even if not labeled as such in the disclosure.

It will also be understood that the system according to the presently disclosed subject matter can be implemented, at least partly, as a suitably programmed processor. Likewise, the presently disclosed subject matter contemplates a computer program being readable by a computer (processor) for executing the disclosed method. The presently disclosed subject matter further contemplates a non-transitory machine-readable memory tangibly embodying a program of instructions executable by the machine for executing the disclosed method.

While various embodiments have been shown and described, it will be understood that there is no intent to limit the invention by such disclosure, but rather, it is intended to cover all modifications and alternate constructions falling within the scope of the invention, as defined in the appended claims.

The invention claimed is:

1. A system for receiving signals from an array antenna that includes a first number of antenna elements, comprising:
   a different frequencies generator module configured to generate a first number of different frequency signals each shifted by a given extent relative to a neighboring frequency signal, covering collectively a given frequency bandwidth;
   a first number of multipliers each configured to receive a respective array antenna element analog signal and a respective frequency signal of said first number of frequency signals and generate a corresponding multiplied analog signal, giving rise to a first number of multiplied analog signals extending over said given frequency bandwidth;
   a first number of filter modules each coupled to a respective multiplier such that said multiplied analog signals are each filtered to reduce interference to neighboring multiplied signals;
   a second number of summation modules configured to receive the first number of multiplied analog signals from said multipliers and generate a second number of summed analog signals extending over said given frequency bandwidth;
   a second number of analog to digital converters configured to receive said summed analog signals that extend over said given frequency bandwidth and generate a second number of summed digital signals;
   said summed digital signals are capable of being fed to a digital processor for generating a processed signal of said array antenna,
   wherein said second number of analog to digital converters falls in the range of 1 to less than said first number of antenna elements.

2. The system according to claim 1, further comprising a first number of down converter modules configured to generate said array antenna element analog signals.

3. The system according to claim 1, wherein said second number of analog to digital converters is 1.

4. A system for receiving signals from an array antenna that includes a first number of antenna elements, comprising:
   a codes generator module configured to generate a first number of different code signals each characterized by a unique code;
   a first number of down converter modules configured to generate array antenna element analog signals;
   a first number of multipliers each configured to receive a respective array antenna element analog signal of said array antenna element analog signals and a respective code signal of said first number of code signals and generate a corresponding multiplied analog signal characterized by unique code, giving rise to a first number of multiplied analog signals;
   a first number of filter modules each following a respective down converter module of said down converter modules and preceding a respective multiplier such that said array antenna element analog signals are filtered, wherein filtering of said array antenna element analog signals reduces adjacent channel interference between different ones of the first number of multiplied analog signals;
   a second number of summation modules configured to receive the first number of multiplied analog signals from said multipliers and generate a second number of summed analog signals;
   a second number of analog to digital converters configured to receive said summed analog signals and generate a second number of summed digital signals;
   a divider module configured to receive said second number of summed digital signals and divide them into a first number of digitally divided signals each corresponding to a respective array antenna element analog signal of an antenna element of said array of antenna elements; and
   a codes generator digital module configured to generate said first number of different code digital signals each characterized by a second unique code,
   wherein said second number of summed digital signals are capable of being fed to a digital processor being configured to utilize said second unique code for generating a processed signal of said array antenna,
   wherein said second number of analog to digital converters falls in the range of 1 to less than said first number of antenna elements.

5. The system according to claim 4, wherein said second number of analog to digital converters is 1.

6. The system according to claim 4, wherein said array antenna is a phased array antenna.

7. A method for receiving signals from an array antenna that includes a first number of antenna elements, comprising:
   generating a first number of different frequency signals each shifted by a given extent relative to a neighboring frequency signal, covering collectively a given frequency bandwidth;
   receiving a respective array antenna element analog signal and a respective frequency signal of said first number of frequency signals and generating a corresponding multiplied analog signal, giving rise to a first number of multiplied analog signals extending over said given frequency bandwidth;
   filtering each of said multiplied analog signals, to reduce interference to neighboring multiplied signals;
   receiving, by a second number of summation modules, the first number of multiplied analog signals and generating a second number of summed analog signals extending over said given frequency bandwidth;

receiving said summed analog signals that extend over said given frequency bandwidth and generating a second number of summed digital signals;

wherein said summed digital signals are capable of being digitally processed for generating a processed signal of said array antenna, and wherein said second number of summation modules falls in the range of 1 to less than said first number of antenna elements.

8. A method for receiving signals from an array antenna that includes a first number of antenna elements, comprising:

generating, by a codes generator module, a first number of different code signals each characterized by a unique code;

generating array antenna element analog signals using a first number of down converter modules;

filtering said array antenna element analog signals;

receiving a respective array antenna element analog signal of said array antenna element analog signals after the filtering and a respective code signal of said first number of code signals, and generating a corresponding multiplied analog signal characterized by unique code, giving rise to a first number of multiplied analog signals, wherein filtering of said array antenna element analog signals reduces adjacent channel interference between different ones of the first number of multiplied analog signals;

receiving, by a second number of summation modules, the first number of multiplied analog signals and generating a second number summed analog signals;

receiving said summed analog signals and generating a second number of summed digital signals;

receiving said second number of summed digital signals and dividing them into a first number of digitally divided signals each corresponding to a respective array antenna element analog signal of an antenna element of said array of antenna elements; and generating, by a codes generator digital module, said first number of different code digital signals each characterized by a second unique code, wherein said second number of summed digital signals are capable of being digitally processed to utilize said second unique code for generating a processed signal of said array antenna, and wherein said second number of summation modules falls in the range of 1 to less than said first number of antenna elements.

9. A computer program product, comprising a non-transitory computer usable medium having a computer readable program code embodied therein, said computer readable program code adapted to be executed to implement a method for receiving signals from an array antenna that includes a first number of antenna elements, comprising:

generating, by a codes generator module, a first number of different code signals each characterized by a unique code;

generating array antenna element analog signals using a first number of down converter modules;

filtering said array antenna element analog signals;

receiving a respective array antenna element analog signal of said array antenna element analog signals after the filtering and a respective code signal of said first number of code signals, and generating a corresponding multiplied analog signal characterized by unique code, giving rise to a first number of multiplied analog signals, wherein filtering of said array antenna element analog signals reduces adjacent channel interference between different ones of the first number of multiplied analog signals;

receiving, by a second number of summation modules, the first number of multiplied analog signals and generating a second number summed analog signals;

receiving said summed analog signals and generating a second number of summed digital signals;

receiving said second number of summed digital signals and dividing them into a first number of digitally divided signals each corresponding to a respective array antenna element analog signal of an antenna element of said array of antenna elements; and generating, by a codes generator digital module, said first number of different code digital signals each characterized by a second unique code, wherein said second number of summed digital signals are capable of being digitally processed to utilize said second unique code for generating a processed signal of said array antenna, and wherein said second number of summation modules falls in the range of 1 to less than said first number of antenna elements.

10. The system for receiving signals from an array antenna according to claim 1, further comprising:

a divider module configured to receive said second number of summed digital signals and divide them into a first number of digitally divided signals each corresponding to a respective array antenna element analog signal of an antenna element of said array of antenna elements;

a different frequencies generator digital module configured to generate said first number of different frequency digital signals each shifted by a given extent relative to a neighboring frequency digital signal, covering collectively a given frequency bandwidth;

a first number of digital multipliers each configured to receive a respective digitally divided signal of said digitally divided signals and a respective frequency digital signal of said first number of frequency digital signals, and generate a corresponding multiplied digital signal, giving rise to a first number of multiplied digital signals extending over said given frequency bandwidth; and the digital processor configured to receive said first number of multiplied digital signals for generating a processed signal of said array antenna.

11. The system for receiving signals from an array antenna according to claim 4, further comprising:

a first number of digital multipliers, each configured to receive a respective digitally divided signal of said digitally divided signals and a respective code digital signal of said first number of code digital signals, and generate a corresponding multiplied digital signal characterized by said second unique code, giving rise to a first number of multiplied digital signals; and the digital processor configured to receive said first number of multiplied digital signals for generating a processed signal of said array antenna.

12. The method according to claim 8, wherein said second number of analog to digital converters is 1.

13. The method according to claim 8, wherein said array antenna is a phased array antenna.

14. The computer program product according to claim 9, wherein said second number of analog to digital converters is 1.

15. The computer program product according to claim 9, wherein said array antenna is a phased array antenna.

\* \* \* \* \*